United States Patent
Arpaia et al.

(10) Patent No.: US 6,192,225 B1
(45) Date of Patent: Feb. 20, 2001

(54) DIRECT CONVERSION RECEIVER

(75) Inventors: Domenico Arpaia, Cary; Charles Gore, Jr., Durham, both of NC (US)

(73) Assignee: Ericsson Inc., Research Triangle Park, NC (US)

(*) Notice: Under 35 U.S.C. 154(b), the term of this patent shall be extended for 0 days.

(21) Appl. No.: 09/064,930

(22) Filed: Apr. 22, 1998

(51) Int. Cl.[7] .................................................. H04Q 7/20
(52) U.S. Cl. ........................................ 455/196.1; 455/264
(58) Field of Search ........................... 455/324, 303, 455/304, 255, 256, 257, 196.1, 296, 302, 313, 316, 264, 265, 186.1, 314, 317; 375/316, 328, 329, 334, 335, 259, 260, 261, 349, 344, 346, 371

(56) References Cited

U.S. PATENT DOCUMENTS

| | | | |
|---|---|---|---|
| 4,646,031 | * 2/1987 | Fast et al. | 331/25 |
| 4,736,390 | 4/1988 | Ward et al. | 435/320.1 |
| 4,864,643 | 9/1989 | French et al. | 455/302 |
| 4,955,039 | 9/1990 | Rother et al. | 375/316 |
| 5,052,050 | 9/1991 | Collier et al. | 455/296 |
| 5,095,533 | 3/1992 | Loper et al. | 455/245 |
| 5,095,536 | 3/1992 | Loper | 455/324 |
| 5,179,730 | 1/1993 | Loper | 455/266 |
| 5,230,099 | 7/1993 | Loper | 455/324 |
| 5,249,203 | 9/1993 | Loper | 375/97 |
| 5,303,417 | 4/1994 | Laws | 455/314 |
| 5,396,571 | * 3/1995 | Minami | 455/260 |
| 5,436,931 | * 7/1995 | Minami | 375/334 |
| 5,438,692 | 8/1995 | Mohindra | 455/324 |
| 5,451,899 | 9/1995 | Lawton | 329/302 |
| 5,507,036 | 4/1996 | Vagher | 455/295 |
| 5,530,929 | 6/1996 | Lindqvist et al. | 455/324 |
| 5,537,305 | * 7/1996 | Colotti | 327/45 |
| 5,564,097 | 10/1996 | Swanke | 455/302 |
| 5,576,665 | * 11/1996 | Erhage | 311/14 |
| 5,633,898 | * 5/1997 | Kishigami et al. | 375/344 |
| 5,640,697 | * 6/1997 | Orndorff | 455/315 |
| 5,742,415 | * 4/1998 | Manning et al. | 359/128 |
| 5,764,700 | * 6/1998 | Makinen | 375/272 |
| 5,770,979 | * 6/1998 | Kolanko et al. | 331/179 |
| 5,812,612 | * 9/1998 | Saito | 375/272 |
| 5,949,830 | * 9/1999 | Nakanishi | 455/209 |

FOREIGN PATENT DOCUMENTS 2166311    4/1986   (GB) .

* cited by examiner

Primary Examiner—Dwayne D. Bost
Assistant Examiner—Jean A Gelin
(74) Attorney, Agent, or Firm—Wood, Phillips, VanSanten, Clark & Mortimer

(57) ABSTRACT

A homodyne receiver according to the present invention includes a signal input and first and second mixers coupled to the signal input. A local oscillator provides a reference signal at the frequency of modulation of the input signal. The reference signal output by the local oscillator is passed through a switchable phase change element, the output of which is coupled directly to the first mixer and indirectly to the second mixer through a second phase change element. The switchable phase change element changes the phase of an input signal by a predetermined phase based on the state of a control input, such that the output of the phase change element in one state is $\pi$ radians out of phase with the output of the phase change element in the other state. The second phase change element changes the phase of an input signal by $\pi/2$ radians. The outputs of the mixers are coupled to a pair of switchable inverters and low pass filters. Switching of the switchable phase change element and the switchable inverters is controlled by a switching oscillator.

22 Claims, 3 Drawing Sheets

DIRECT CONVERSION RECEIVER

FIELD OF THE INVENTION

The present invention generally relates to a direct conversion receiver (or a homodyne receiver) that separates a received radio signal into its in-phase (I) and quadrature (Q) components while also reducing second-order intermodulation products due to non-linearities in the mixers and reducing feedback from the tuned local oscillator.

BACKGROUND

A superheterodyne receiver is currently the most common type of receiver used in modern communications devices. Such receivers can be found in virtually any home, office or automobile within a television set, telephone or radio. A superheterodyne receiver mixes (or multiplies) an incoming radio-frequency (RF) signal (carried at frequency $f_1$) with a sinusoid signal (at a frequency $f_2$) generated by a local oscillator. The resulting output signal comprises two frequency-shifted versions of the incoming signal centered at the sum and difference of the combining frequencies ($f_1+f_2$ and $f_1-f_2$). Typically the highest frequency components (centered at $f_1+f_2$) are filtered out using a band pass filter and the output signal only contains the intermediate-frequency (IF) components (centered at $f_1-f_2$). This process may be repeated several times in high-performance superheterodyne receivers.

While superheterodyne receivers are widely used, they use expensive and non-integrable RF and IF components such as band pass filters. As a result, superheterodyne receivers are not ideal for applications in small, low cost mobile communication systems such as cellular phones, pagers, cordless phones, and the like.

Alternative receivers, such as the direct conversion receiver (or homodyne receiver), are well-known in the art and potentially offer significant advantages over the superheterodyne receiver. A traditional direct conversion receiver as shown in FIG. 1 directly converts an incoming signal into its baseband in-phase and quadrature components without any intermediate translation into an IF signal. The operation of this traditional direct conversion receiver is simple. An incoming bandpass signal g(t) (which can be mathematically represented by $g(t)=g_i(t)\cos(2\pi f_1 t)-g_q(t)\sin(2\pi f_1 t)$ is received at the RF input and then passed through a preselector filter 1 and a low-noise amplifier (LNA) 2. The preselector filter 1 is simply a band pass filter designed to pass the desired signal g(t) and to reject spurious out-of-band signals. In most applications, the bandwidth of the preselector filter is much greater than the bandwidth of the desired signal. Furthermore, the preselector filter may pass unwanted signals in addition to the desired signal.

After passing through the preselector filter 1, the signal g(t) is split and sent through the two mixers 3, 3'. In the upper mixer 3', the signal g(t) is mixed with a sinusoid tuned to the same frequency as the carrier frequency (e.g., $\cos(2\pi f_1 t)$). In the lower mixer 3, the signal g(t) is mixed with the same sinusoid as in the upper mixer 3', but with a phase change of $\pi/2$ (e.g., $\sin(2\pi f_1 t)$). The mixers 3, 3' produce the in-phase ($g_i(t)$) and quadrature ($g_q(t)$) components of the desired signal (g(t)) centered at baseband and at twice the carrier frequency ($2f_c$). The high frequency components are eliminated by the low pass filters 6, 6', and the in-phase and quadrature signals are finally amplified by the amplifiers 7,7'.

There are several advantages of a direct conversion receiver over the more popular superheterodyne receiver. First, the direct conversion receiver directly converts the incoming signal into its baseband signal directly and eliminates the step of initially translating the RF signal into an IF signal. Thus, all of the intermediate filters, mixers and amplifiers can be omitted and the circuit is simplified. Secondly, with the exception of the preselector filter, the direct conversion receiver employs only low pass filters rather than band pass filters. Normally, it is easier to integrate a low pass filter onto a single chip than a band pass filter. Thus, the direct conversion receiver may be largely constructed on a single integrated circuit, which makes it smaller and less expensive than a superheterodyne receiver.

While there are advantages to direct conversion receivers over superheterodyne receivers, the traditional direct conversion receiver suffers from some disadvantages. One problem with traditional direct conversion receivers is second-order distortion present in the mixer. Second-order distortion is caused by the fact that a mixer is inherently a non-linear device. When an off-channel RF signal is detected along with the desired signal, the non-linearity in the mixers produce the second harmonic of the undesired signal at baseband plus a DC offset. Since the direct conversion receiver also shifts the desired signal to baseband, this second-order distortion produced by the mixer can significantly reduce the performance of the receiver. Moreover, the mixer can operate like a "square law" detector and convert the envelope of a strong interferer to baseband. If the envelope of the interferer is constant in time, then a DC offset appears at baseband. In this case, there are several methods known in the art to suppress this unwanted DC offset. For example, the DC offset may be attenuated by high pass filtering the baseband output of the mixers. While this method is effective to eliminate a DC offset, it is ineffective for distortion due to a non-constant envelope of an interferer. Thus, a need exists for a homodyne receiver which is capable of attenuating distortion caused by either a constant or a non-constant envelope of an interferer.

Another problem with direct conversion receivers is spurious emissions. The main source of spurious emissions in a direct conversion receiver is local oscillator leakage. In an ordinary superheterodyne receiver, the local oscillator leakage to the antenna is attenuated by the first receiver bandpass filter. In a direct conversion receiver, however, the local oscillator frequency lies within the passband of the preselector filter. Thus, local oscillator leakage is not suppressed in the traditional direct conversion receiver.

SUMMARY AND OBJECTS OF THE INVENTION

A homodyne receiver according to the present invention includes a signal input and first and second mixers coupled to the signal input. A local oscillator provides a reference signal at the frequency of modulation of the input signal. The reference signal output by the local oscillator is passed through a switchable phase change element, the output of which is coupled directly to the first mixer and indirectly to the second mixer through a second phase change element. The switchable phase change element changes the phase of an input signal by a predetermined phase based on the state of a control input. The output of the phase change element in one state is π radians out of phase with the output of the phase change element in the other state. The second phase change element changes the phase of an input signal by π/2 radians. The outputs of the mixers are coupled to a pair of switchable inverters and low pass filters. Switching of the switchable phase change element and the switchable inverters is controlled by a switching oscillator.

It is the object of the present invention to construct a radio receiver having improved reception qualities due to increased distortion suppression.

It is a further object of the present invention to construct a radio receiver that reduces spurious emissions from a local oscillator.

DETAILED DESCRIPTION OF THE PREFERRED EMBODIMENT

Figure 1:
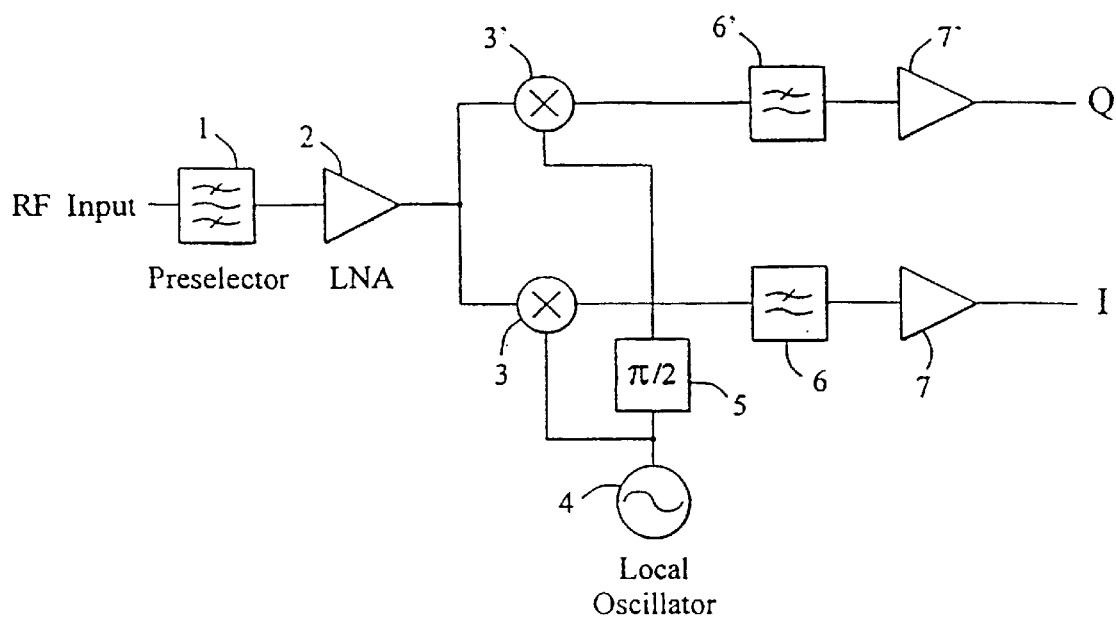
FIG. 1 shows a traditional direct conversion receiver.
Figure 2:
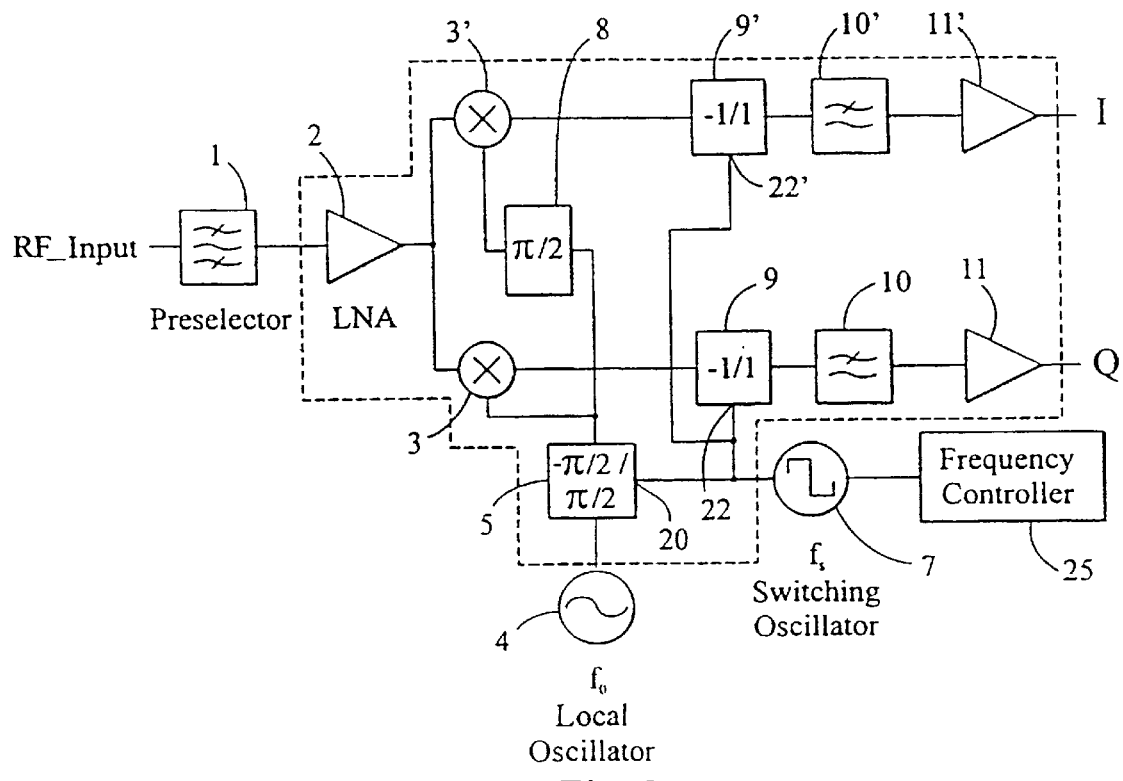
FIG. 2 shows the preferred embodiment of the present invention.

A block diagram of the preferred embodiment of the present invention is illustrated in FIG. 2. An RF signal is received at the RF input and routed to preselector filter 1 and then to a low-noise (LN) amplifier 2. The incoming signal is then split and fed into upper mixer 3' and lower mixer 3. Local oscillator 4 produces a sinusoid tuned to the same frequency as the carrier wave of the incoming RF signal. The sinusoid produced by the local oscillator 4 is fed into one input of switchable phase change element 5 which alters the phase of the input sinusoid by $-\pi/2$ or $\pi/2$ radians (or by $-90°$ and $90°$) based on the state of control input 20. While the phase change does not necessarily have to be $-\pi/2$ and $\pi/2$, the difference between the first phase change amount and the second phase change amount must be equal to $\pi$ radians (or 180°).

Switching oscillator 7 produces a switching signal that has two states (for example, a square wave pulse train) corresponding to an "on" state and an "off" state. This switching signal is fed into the control input 20 of phase change element 5 and into the control inputs 22, 22' of the switchable inverter elements 9, 9'. When the switching signal is in an "on" state, the phase change element 5 and inverter elements 9, 9' are set to $-\pi/2$ and $-1$ respectively. When the switching signal is in the "off" state, the phase change element 5 and inverter elements 9, 9' are set to $\pi/2$ and 1 respectively.

The output of the phase change element 5 is directly connected to the second input of the lower mixer 3 and is also connected to a second phase change element 8. The second phase change element 8 continuously changes the phase of the input by $\pi/2$. The output of second phase element 8 comprises the second input to the upper mixer 3'.

The output of the upper mixer 3' is fed into the upper inverter element 9', and the output of the lower mixer 3 is fed into the lower inverter element 9. The output of each inverter element 9, 9' is then passed through a channel filter 10, 10' and finally through an amplifier 11, 11'.

The present invention operates to suppress any intermodulation products generated in the two mixers which is unchanged by a 180° phase shift on the local oscillator. Since all second-order intermodulation products generated by the mixers are unaffected by a 180° phase shift on the local oscillator, the invention effectively reduces distortion due to the second harmonic of an off-channel RF signal, a DC offset and the amplitude envelope of a strong interferer without significantly affecting the reception quality of the desired signal.

To illustrate the operation of the preferred embodiment of the present invention, suppose a desired signal g(t) propagated at a known frequency $f_1$ is present at the RF input as indicated in FIG. 2. After g(t) is passed through the preselector filter 1 and the LN amplifier 2, it is then split and sent to the upper 3' and lower mixer 3. The local oscillator 4 is tuned to produce a sinusoid, for example a cosine, at the same frequency as the carrier frequency of g(t) (i.e., $\cos(2\pi f_1 t)$). The phase of this sinusoid is changed by the phase change element 5 by either $-\pi/2$ or $\pi/2$. Thus, the sinusoid produced by the local oscillator 4 changes from $\cos(2\pi f_1 t)$ to $\cos(2\pi f_1 t - \pi/2) = -\sin(2\pi f_1 t)$ or $\cos(2\pi f_1 t + \pi/2) = \sin(2\pi f_1 t)$, depending upon the state of the phase change element 5. This sinusoidal signal is then split and one branch is fed directly into the input of the lower mixer 3 while the other branch is fed through a second phase change element 8. The second phase change element 8 changes the phase of the input, in this case $\pm\sin(2\pi f_1 t)$, by $\pi/2$. Thus, in this example, the input to the upper mixer 3' becomes $\pm\sin(2\pi f_1 t + \pi/2) = \pm\cos(2\pi f_1 t)$.

The mixers 3, 3' multiply g(t) by the sinusoid produced by the local oscillator 4 to produce $\pm g(t)*\sin(2\pi f_1 t)$ in the upper mixer 3' and $\pm g(t)*\cos(2\pi f_1 t)$ in the lower mixer 3. The output of the mixers 3, 3' is then fed to the inverters 9, 9' that switch state synchronously with the local oscillator's phase change. In other words, when the phase change element 5 shifts by $-\pi/2$ the inverters 9, 9' are set to $-1$. Similarly, when the phase change element shifts by $\pi/2$, the inverters 9, 9 are set to 1. The inverters 9, 9' effectively "reconstruct" the I and Q components of the desired signal and produce an output of $g(t)*\sin(2\pi f_1 t)$ and $g(t)*\cos(2\pi f_2 t)$. Therefore, the first order Q and I components of the desired signal are not affected by the 180° phase shift coupled with the inverters.

While the desired signal is not affected by the operation of the phase change element 5 and inverters 9, 9', second-order intermodulation products can be significantly attenuated. This is because all second-order intermodulation products are not affected by the 180° phase shift on the local oscillator 4 but are affected by the sign change in the inverters 9,9'. Thus, the inverters 9, 9' effectively "chop-up" the second-order products by switching the polarity of the signal at a rate equal to the frequency of the switching oscillator 7. This translates any second-order distortion at baseband to the stopband of the low pass filters 10, 10'. Of course, the system would also down convert any second-order distortion appearing around the frequency of the switching oscillator 7. In order to reduce the down conversion of any second-order distortion, the frequency of the switching oscillator 7 should be greater than the bandwidth of the preselector filter 1.

While working to attenuate second-order distortion present at baseband, the present invention has a second benefit in that it also reduces spurious emissions from the RF input generated by the local oscillator 4. Spurious emissions are a problem in prior art homodyne receivers, since signals generated by the local oscillator can propagate back through the mixers 3, 3'.

Referring again to FIG. 2, in the present invention, the signal generated by the local oscillator 4 is passed through the switchable phase change element 5 prior to being applied to mixers 3, 3'. This has the effect of modulating the spectrum of the local oscillator 4 output signal. If the switching frequency $f_0$ is selected such that it is greater than the bandwidth of the preselector filter 1, the stopband of the preselector filter helps to prevent the signal from being coupled back to the RF input, thus reducing spurious emissions from local oscillator leakage. Thus, in the preferred embodiment, the frequency of the switching oscillator is selected such that it is greater than the bandwidth of the preselector filter 1.

While the switching oscillator should have a frequency greater than the bandwidth of the preselector filter, it does not need to be constant. In the preferred embodiment, the frequency of the switching oscillator is changed according to a pseudorandom pattern by frequency controller 25. Frequency controller 25, which provides a means for controlling the switching frequency fs of switching oscillator 7, may be implemented as a phase-locked loop or other frequency control device, the design of which are well known in the art. This has the effect of spreading the power spectrum and further reducing local oscillator leakage if the bandwidth of the spread signal is made wider than the resolution bandwidth of the spectrum analyzer used to measure this leakage.

In the preferred embodiment, the local oscillator and the switching oscillator are locked to a single source and all of the elements within the dashed lines shown in FIG. 2 are implemented in an integrated circuit.

Figure 4:
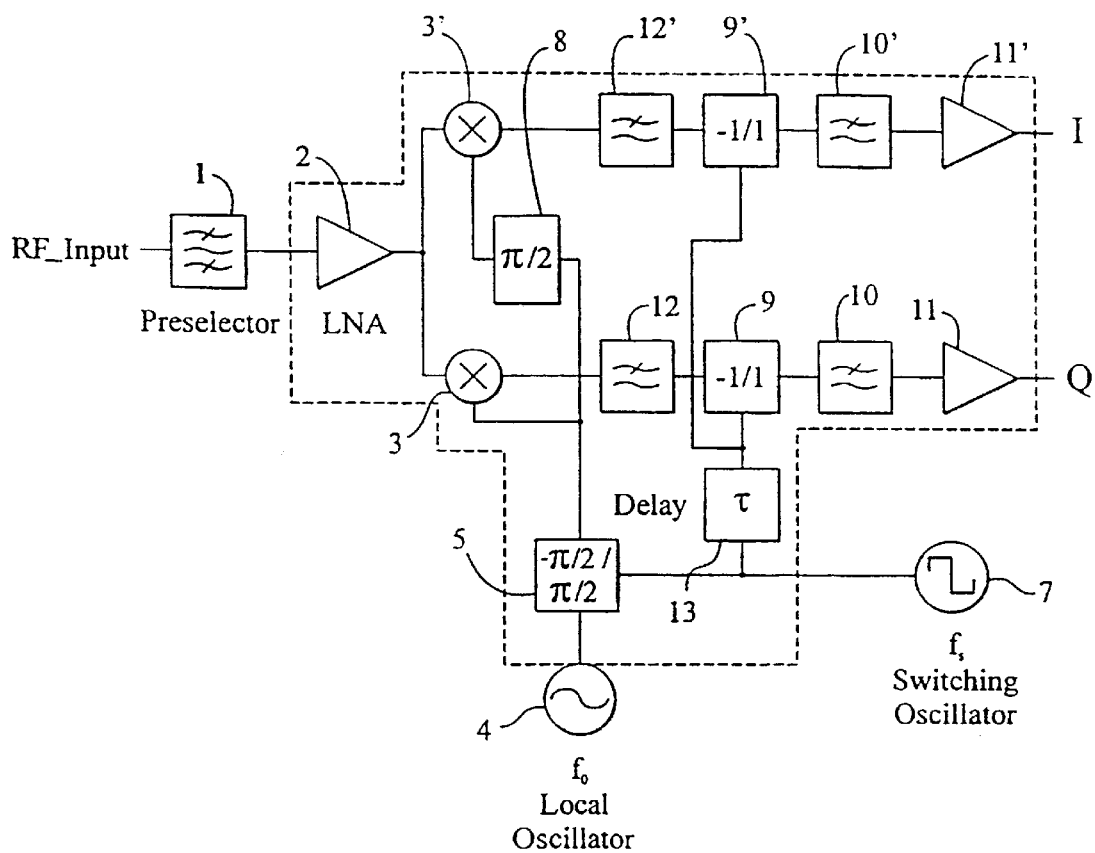
FIGS. 4 and 5 show alternative embodiments of the present invention.
Figure 5:
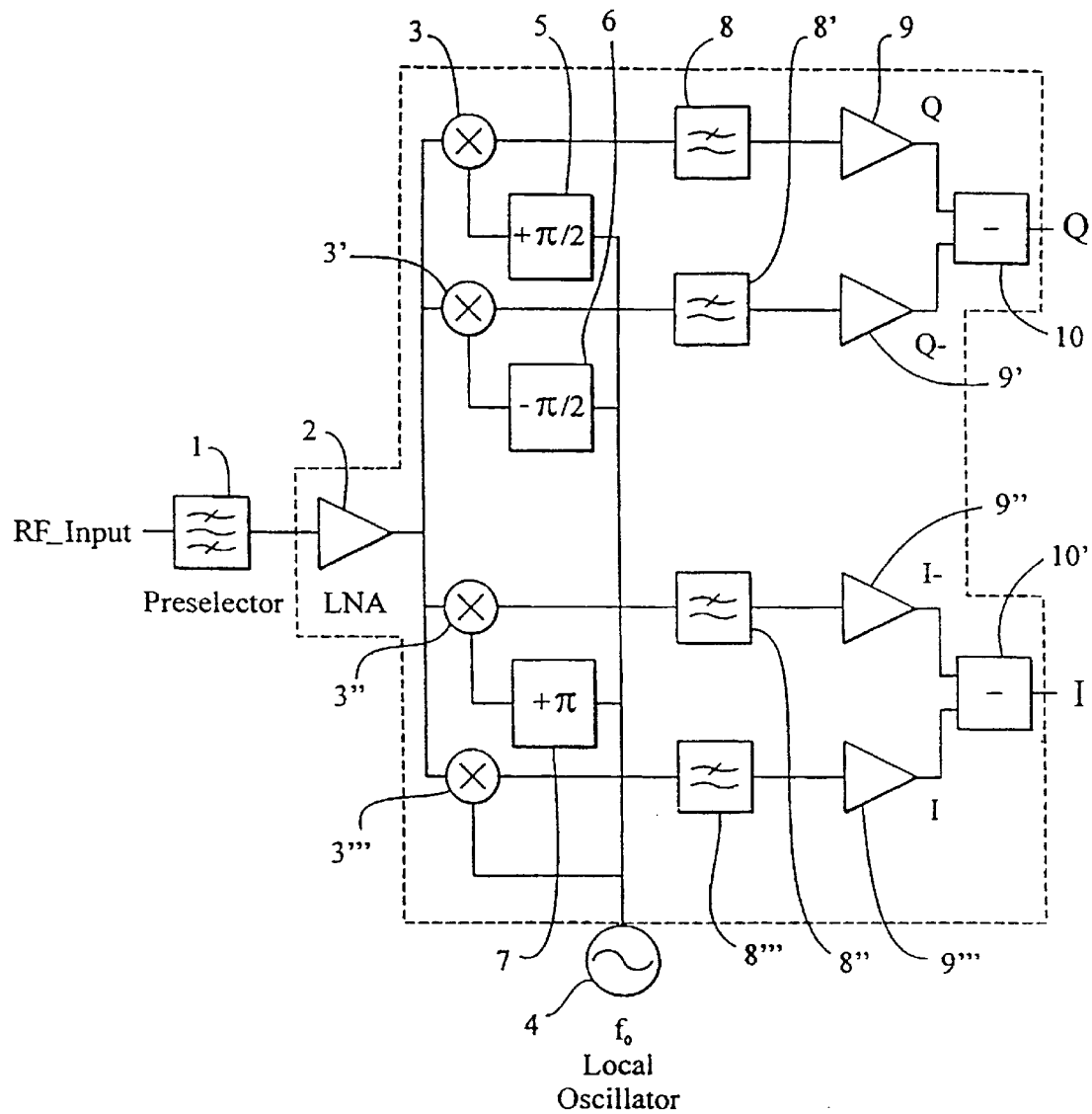

FIGS. 4 and 5 show additional embodiments of the present invention. In FIG. 4, a low pass filter 12, 12' is added between each of the mixers 3, 3' and the inverters 9, 9'. Also, the signal produced by the switching oscillator 7 that feeds to each of the inverters is delayed by time τ in delay element 13. The time delay (τ) is set to equal the group delay of low pass filters 12, 12'. These low pass filters 12, 12' are useful to limit the bandwidth of the signal at the inverters' 9, 9' input. The corner frequencies of low pass filters 12, 12' are, in general, much higher than the switching frequency $f_0$.

FIG. 5 shows another embodiment of the present invention. In this circuit, the received signal is split into four channels and each channel is fed into a separate mixer 3,3',3",3'''. A local oscillator 4 feeds a sinusoid into each of the mixers 3,3',3",3'''. In the top mixer 3, the phase of the local oscillator signal is changed by π/2 (i.e., $\sin(2\pi f_1 t)$). In the top-middle mixer 3', the phase of the local oscillator is changed by −π/2 (i.e., $-\sin(2\pi f_1 t)$. In the bottom-middle mixer 3", the phase of the local oscillator signal is changed by π (i.e., $-\cos(2\pi f_1 t)$). In the bottom mixer 3''', the phase of the local oscillator signal is not changed (i.e., $\cos(2\pi f_1 t)$. Each of the mixer 3,3',3",3''' outputs are fed through a low pass filter 8,8',8",8''' and amplified by amplifiers 9,9',9",9'''. Finally, the top two channels are subtracted by subtractor 10 to eliminate second-order intermodulation products while yielding the quadrature component of the desired signal. Similarly, the bottom two channels are subtracted by subtractor 10' to eliminate second-order intermodulation products while yielding the in-phase component of the desired signal.

Figure 3:
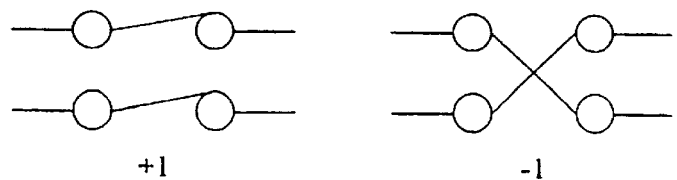
FIG. 3 shows a circuit for implementing the inverter elements of the present invention.

Each of the elements in all of the embodiments of the present invention are well-known in the art and can be implemented in a variety of ways depending upon the specific application. For example, the inverter elements can be implemented by a double voltage switch as shown in FIG. 3. When the switching signal received by the inverter element 3, 3' is in the first state, then the inverters switch to the −1 state and invert the voltage of the signal. Similarly, when the switching signal received by the inverter elements 3, 3' is in the second state, then the inverters switch to the +1 state and pass the signal unchanged. Alternatively, the inverters 3, 3' could be implemented by switching current rather than voltage.

The present invention works to eliminate even-order (second-order being the most severe) distortion due to intermodulation products caused by the non-linearity of the mixers.

Those skilled in the art will recognize that various modifications and changes may be made to the present invention without departing from the true spirit and scope thereof, which is set forth in the following claims.

We claim:

1. An apparatus for receiving a radio frequency (RF) signal, comprising:

an RF input for receiving a modulated RF signal;

a mixer having first and second inputs and an output, the first input of said mixer electrically coupled to said RF input;

a local oscillator for generating a reference signal;

a switching oscillator for generating a switching signal having a first state and a second state;

a switchable phase change element having a signal input, a control input and an output, wherein said signal input is electrically coupled with said local oscillator, said control input is electrically coupled to said switching oscillator, the output of said phase change element is electrically coupled to the second input of said mixer;

a switchable inverter having a signal input, a control input and an output, the output of said mixer is electrically coupled to the signal input of said inverter and the output of said switching oscillator is coupled to the control input of said inverter; and a first low pass filter electrically coupled to the output of said first switchable inverter, the first low pass filter having a bandwidth less than a switching frequency of the switchable inverter.

2. An apparatus as recited in claim 1 further comprising:

a second mixer having a first input, a second input and an output, wherein the first input is electrically coupled to said input means;

a fixed phase change element having an input and an output, wherein the input of said fixed phase change element is electrically coupled with the output of said phase change element and the output of said fixed phase change element is electrically coupled with the second input of said second mixer; and a second switchable inverter having a signal input, a control input and an output, such that the output of said second mixer is electrically coupled to the signal input of said second switchable inverter and the output of said switching oscillator is electrically coupled to the control input of said second switchable inverter.

3. An apparatus as recited in claim 2 wherein said switchable phase change element has a first phase change state and a second phase change state, such that said switchable phase change element shifts the phase of an input signal by a first phase shift in said first phase change state and a second phase shift offset by 180 degrees from said first phase shift in said second phase change state.

4. An apparatus as recited in claim 2, further comprising a second low pass filter electrically coupled to the output of said second switchable inverter, the second low pass filter having a bandwidth less than a switching frequency of the second switchable inverter.

5. An apparatus as recited in claim 2 wherein the frequency of the signal generated by said switching oscillator is variable.

6. An apparatus as recited in claim 2 wherein said first and second switchable inverters comprise double voltage switches.

7. An apparatus as recited in claim 4 further comprising a preselector filter having a lower cutoff frequency and an upper cutoff frequency and electrically coupled to said first and second mixers.

8. An apparatus as recited in claim 7 wherein each of said first and second low pass filters has a corner frequency at least equal to the difference between the upper and lower cutoff frequencies of said preselector filter.

9. An apparatus as recited in claim 7 further comprising an amplifier electrically connected in series between said preselector filter and said first and second mixers.

10. An apparatus as recited in claim 9 further comprising:
   a second amplifier electrically connected in series between said first inverter and the first output of the system; and
   a third amplifier electrically connected in series between said second inverter and the second output of the system.

11. An apparatus as recited in claim 7 wherein the frequency of the signal generated by said switching oscillator is greater than the bandwidth of said preselector filter.

12. An apparatus as recited in claim 4 further comprising:
   a third low pass filter connected in series between said first mixer and said first inverter, and having a group delay equal to time τ;
   a fourth low pass filter connected in series between said second mixer and said second inverter, and having a group delay equal to time τ; and
   a delay element connected in series between said inverters and said switching oscillator such that the switching signal sent to said inverters is delayed by time τ.

13. An apparatus as recited in claim 5, wherein the frequency of the signal generated by said switching oscillator is altered according to a predetermined pseudorandom pattern.

14. An apparatus as recited in claim 5, wherein the signal generated by said switching oscillator is a square wave.

15. A method of reducing distortion due to second-order non-linearities and local oscillator leakage in a direct conversion receiver comprising:
   receiving a radio frequency (RF) signal propagated at a known frequency;
   generating a sinusoid with the same frequency as the received RF signal by a local oscillator;
   changing the phase of the generated sinusoid between a first phase change amount and a second phase change amount such that the difference between the first phase change amount and the second phase change amount is 180 degrees;
   mixing the received RF signal and the phase-changed signal in a mixer;
   synchronously inverting the output of the mixer at a switching frequency when the generated sinusoid was changed by the first phase change amount and passing the output of the mixer when the generated sinusoid was changed by the second phase change amount; and
   filtering the signal at a filter bandwidth less than the switching frequency.

16. A method of reducing distortion due to second-order non-linearities and local oscillator leakage in a direct conversion receiver comprising:
   receiving a radio frequency (RF) signal propagated at a known frequency;
   splitting the received RF signal into a first channel and a second channel;
   generating a sinusoid with the same frequency as the received RF signal by a local oscillator;
   changing the phase of the generated signal between a first phase change amount and a second phase change amount such that the difference between the first phase change amount and the second phase change amount is 180 degrees;
   splitting the generated signal into a third and fourth channel;
   changing the phase of the signal propagated in the third channel by 90 degrees;
   mixing the received signal propagated in the first channel with the signal propagated in the third channel to form a sixth channel;
   mixing the received signal propagated in the second channel with the signal propagated in the fourth channel to form a seventh channel;
   synchronously inverting the signal propagated in the sixth and seventh channels at a switching frequency when the generated sinusoid was changed by the first phase change amount and passing the signal propagated in the sixth and seventh channels when the generated sinusoid was changed by the second phase change amount; and
   filtering the signals propagated in the sixth and seventh channels at a filter bandwidth less than the switching frequency.

17. An apparatus for receiving an RF signal propagated at a known frequency comprising:
   an input means for receiving an RF signal;
   a first mixer having a first input, a second input and an output, such that the first input is electrically coupled to said input means;
   a second mixer having a first input, a second input and an output, such that the first input is electrically coupled to said input means;
   a local oscillator tunable to produce an output signal having the same frequency as the desired received signal and directly coupled with said first mixer;
   a first phase change element having an input and an output, such that the input is electrically coupled with said local oscillator and the output is electrically coupled to said first mixer, whereby said first phase change element changes the phase of the input signal by +90 degrees;
   a second phase change element having an input and an output, such that the input is electrically coupled with said local oscillator and the output is electrically coupled to said second mixer, whereby said second phase change element changes the phase of the input signal by −90 degrees;
   a first low pass filter electrically coupled to output of said first mixer;
   a second low pass filter electrically coupled to output of said second mixer; and
   a subtractor element having a first input and a second input and one output such that the first input is electrically coupled to the output of said first low pass filter and said input is electrically coupled to output of said second low pass filter, and whereby said subtractor element subtracts the signal received in its second input from the signal received in its first input.

18. An apparatus as recited in claim 17 further comprising:
   a third mixer having a first input, a second input and an output, such that the first input is electrically coupled to said input means;

a fourth mixer having a first input, a second input and an output, such that the first input is electrically coupled to said input means and said second input is directly connected to output of said local oscillator;

a third phase change element having an input and an output, such that the input is electrically coupled with said local oscillator and the output is electrically coupled to the second input of said third mixer, whereby said phase change element changes the phase of the input signal by 180 degrees;

a third low pass filter electrically coupled to output of said third mixer;

a fourth low pass filter electrically coupled to output of said fourth mixer; and a second subtractor element having a first input and a second input and one output such that the first input is electrically coupled to the output of said third low pass filter and second input is electrically coupled to output of said fourth low pass filter, and whereby said second subtractor element subtracts the signal received in its second input from the signal received in its first input.

19. An apparatus for reducing spurious emissions from a receiver comprising:

a preselector configured to receive an input signal at an input frequency;

a switchable phase change element coupled to an output of a local oscillator; and a switching oscillator having a switching frequency $f_S$ coupled to a control input of said switchable phase change element, the switching frequency $f_S$ being greater than the input frequency.

20. An apparatus as recited in claim 19, further comprising:

means for varying the switching frequency $f_S$ of said switching oscillator.

21. An apparatus as recited in claim 20, wherein said means for varying the switching frequency varies the switching frequency $f_S$ according to a pseudorandom pattern.

22. A method for reducing spurious emissions from a receiver having a local oscillator, comprising:

generating a local oscillator signal;

passing the local oscillator signal through a switchable phase change element; and periodically changing the phase shift provided by the switchable phase change element.

* * * * *